(12) United States Patent
Rudolph

(10) Patent No.: US 8,730,185 B2
(45) Date of Patent: May 20, 2014

(54) USER INTERFACE WITH ANNULAR TOUCH SENSOR ARRAY

(75) Inventor: John Rudolph, Antioch, TN (US)

(73) Assignee: Electrolux Home Products, Inc., Charlotte, NC (US)

( * ) Notice: Subject to any disclaimer, the term of this patent is extended or adjusted under 35 U.S.C. 154(b) by 978 days.

(21) Appl. No.: 12/645,681

(22) Filed: Dec. 23, 2009

(65) Prior Publication Data

US 2011/0148773 A1    Jun. 23, 2011

(51) Int. Cl.
*G06F 3/041* (2006.01)

(52) U.S. Cl.
USPC .......................................... 345/173

(58) Field of Classification Search
None
See application file for complete search history.

(56) References Cited

U.S. PATENT DOCUMENTS

| | | | |
|---|---|---|---|
| 3,886,539 A | 5/1975 | Gould | |
| 4,121,204 A | 10/1978 | Welch et al. | |
| 4,158,216 A | 6/1979 | Bigelow | |
| 4,242,676 A * | 12/1980 | Piguet et al. | 345/174 |
| 4,264,903 A * | 4/1981 | Bigelow | 341/1 |
| 6,403,904 B1 | 6/2002 | Schilling | |
| 6,603,708 B2 | 8/2003 | Tamagawa et al. | |
| 2003/0076306 A1 | 4/2003 | Zadesky et al. | |
| 2003/0095096 A1 | 5/2003 | Robbin et al. | |
| 2004/0007566 A1 * | 1/2004 | Staebler et al. | 219/445.1 |
| 2005/0052429 A1 | 3/2005 | Philipp | |
| 2005/0057529 A1 | 3/2005 | Serrano | |
| 2006/0036338 A1 | 2/2006 | Harkom et al. | |
| 2007/0046639 A1 | 3/2007 | Swedin | |
| 2008/0094077 A1 | 4/2008 | Philipp | |
| 2008/0276192 A1 * | 11/2008 | Jones et al. | 715/772 |
| 2009/0009491 A1 | 1/2009 | Grivna | |
| 2009/0090605 A1 | 4/2009 | Arione et al. | |
| 2009/0115431 A1 | 5/2009 | Philipp | |
| 2010/0164871 A1 * | 7/2010 | Shigeta et al. | 345/169 |
| 2010/0198425 A1 | 8/2010 | Donovan | |

FOREIGN PATENT DOCUMENTS

| | | |
|---|---|---|
| DE | 19817195 | 9/1999 |
| DE | 102005049802 | 4/2007 |
| DE | 102006001283 | 7/2007 |
| WO | WO 2008020538 A1 * | 2/2008 |

OTHER PUBLICATIONS

Partial Search Report for PCT/US2010/061981, dated Jun. 8, 2011, 2 pages.

* cited by examiner

*Primary Examiner* — Latanya Bibbins
(74) *Attorney, Agent, or Firm* — Pearne & Gordon LLP

(57) ABSTRACT

Provided is a user interface comprising a substrate having a through-hole, an annular touch sensor array located on the substrate and at least partially surrounding the through-hole, and a display device in alignment the through-hole.

14 Claims, 3 Drawing Sheets

USER INTERFACE WITH ANNULAR TOUCH SENSOR ARRAY

BACKGROUND OF THE INVENTION

1. Field of the Invention

The present invention relates to user interface devices, and more particularly to user interfaces having touch sensors.

2. Description of Related Art

User interface devices can include capacitive touch sensors. Arrays of touch sensors can be arranged side by side to create "sliders," which are touch inputs that can be activated by a user sliding a finger across the sensor array. The touch sensors of the array can be pie shaped and arranged in a disk to create a so-called radial slider.

BRIEF SUMMARY OF THE INVENTION

A problem associated with radial slider devices is that unlike traditional knob inputs (e.g., potentiometers), radial sliders do not provide rotational position or magnitude feedback to the user. A display can be associated with the radial slider to provide some feedback. However, the display would be mounted remote from the radial slider. This increases the size of the user interface (e.g., the radial slider and the remote display) and can render it unsuitable for applications requiring a compact user interface, such as a direct replacement for a knob input.

Therefore, in accordance with one aspect of the present invention, provided is a user interface comprising a substrate having a through-hole, an annular touch sensor array located on the substrate and at least partially surrounding the through-hole, and a display device in alignment with the through-hole.

In accordance with another aspect of the present invention, provided is a user interface comprising a substrate, an annular touch sensor array located on the substrate, and a numerical display located within the annular touch sensor array.

In accordance with another aspect of the present invention, provided is a user interface comprising a substrate, an annular touch sensor array located on the substrate, and a plurality of light-emitting elements forming an annular bar graph inside of the annular touch sensor array.

DETAILED DESCRIPTION OF THE INVENTION

Figure 1:
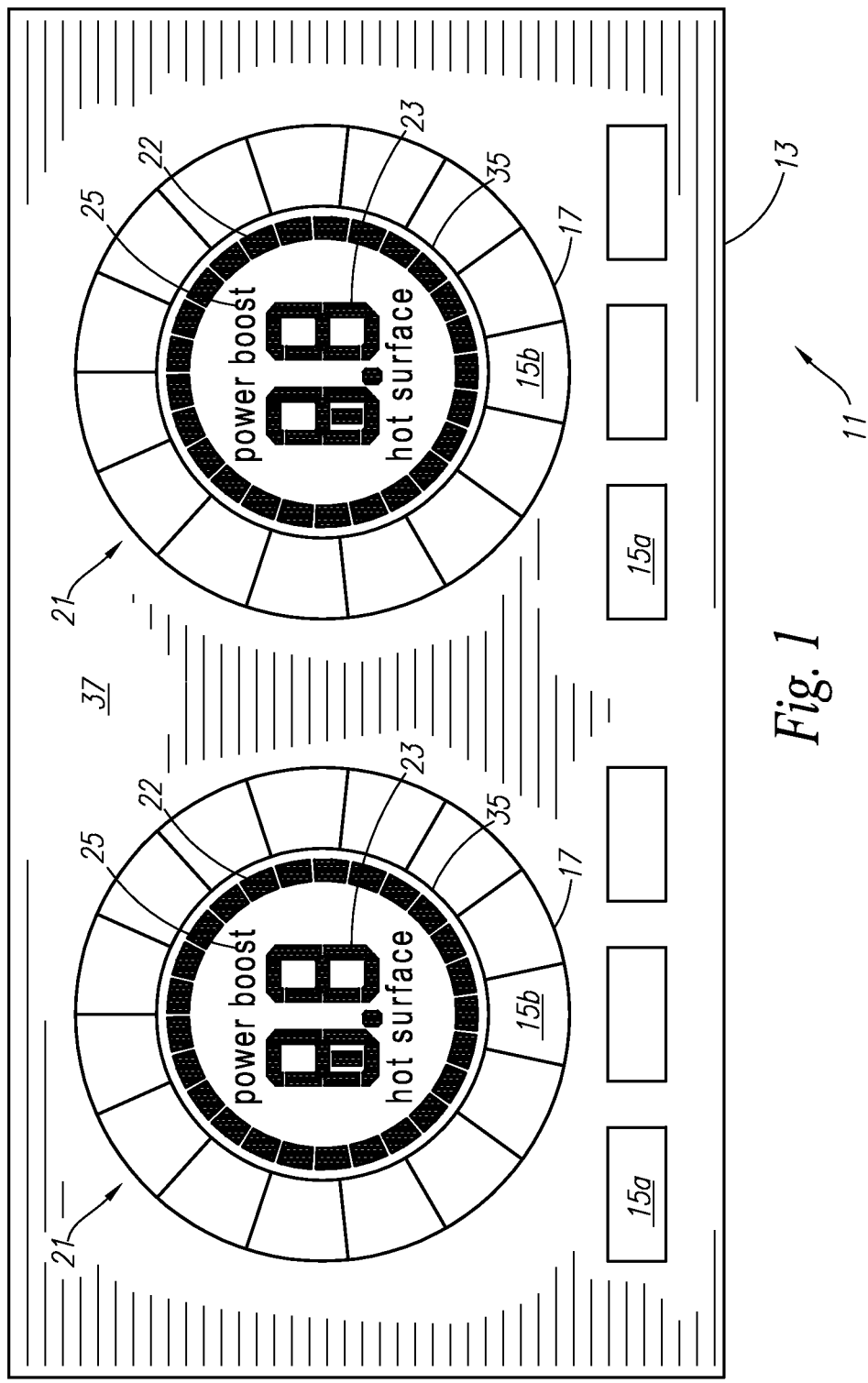
FIG. 1 is a plan view of a user interface board.

The present invention will now be described with reference to the drawings, wherein like reference numerals are used to refer to like elements throughout. In the following description, for purposes of explanation, numerous specific details are set forth in order to provide a thorough understanding of the present invention. It may be evident, however, that the present invention can be practiced without these specific details. Additionally, other embodiments of the invention are possible and the invention is capable of being practiced and carried out in ways other than as described. The terminology and phraseology used in describing the invention is employed for the purpose of promoting an understanding of the invention and should not be taken as limiting.

FIG. 1 shows an example user interface board 11. The user interface board 11 includes a substrate 13, such as a printed circuit board or a flexible circuit board. Located on the substrate are touch sensor electrodes 15a, 15b. Touch sensor electrodes 15b are arranged into an annular touch sensor array 17. The annular touch sensor array 17 is ring-shaped. Located in the center of the annular touch sensor array 17 is a display device 19 (see FIG. 2). The touch sensor electrodes 15a, 15b and display devices form user interfaces 21. It is to be appreciated that any number of user interfaces 21 could be provided on the substrate 13, such as one user interface, two user interfaces, four user interfaces, etc.

The substrate 13 can include a through-hole 35 or aperture for the display device 19 that is located centrally of the annular touch sensor array 17. The annular touch sensor array 17 surrounds the through-hole 35 and the display device 19. The display device 19 is in alignment with the through-hole 35 and mounted to the substrate 13. An annular bar graph 22 is located concentrically within the annular touch sensor array 17, and a multi-segment display 23 and fixed text elements 25 are located within the annular bar graph 22. The annular touch sensor array 17 has an inner circumference at generally the same location as the circumference of the through-hole 35, and the annular bar graph 22 is located entirely within the inner circumference of the annular touch sensor array 17. In other embodiments, the annular bar graph 22 can be located outside of the inner circumference of the annular touch sensor array 17. For example, the annular bar graph 22 can be located behind the annular touch sensor array 17, i.e., between the inner circumference and an outer circumference of the annular touch sensor array, or completely outside of the annular touch sensor array.

In an embodiment, the display device 19 has a generally flat, circular upper surface. The display device 19 is located within the through-hole 35 such that its circular upper surface is mounted flush with an upper surface 37 of the substrate 13, to form a generally smooth, continuous surface of the user interface 21.

Figure 2:
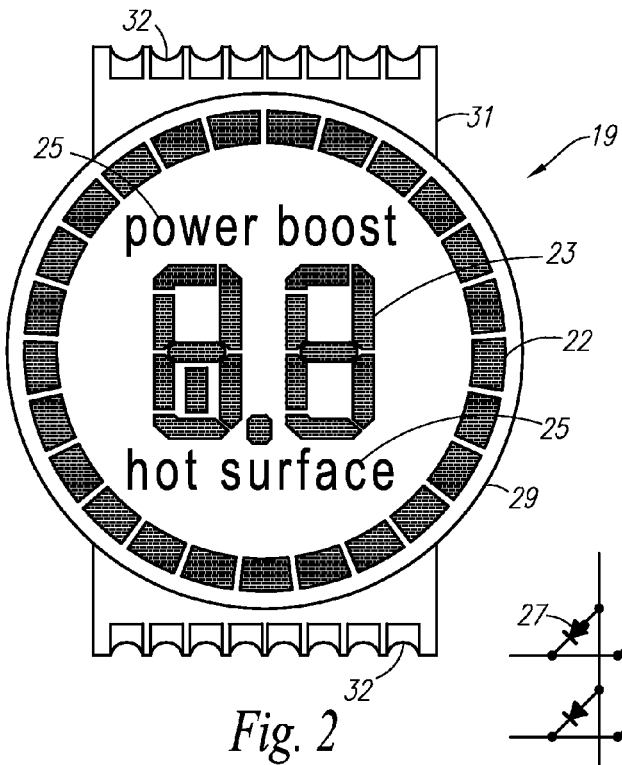
FIG. 2 is a plan view of a display device.
Figure 3:
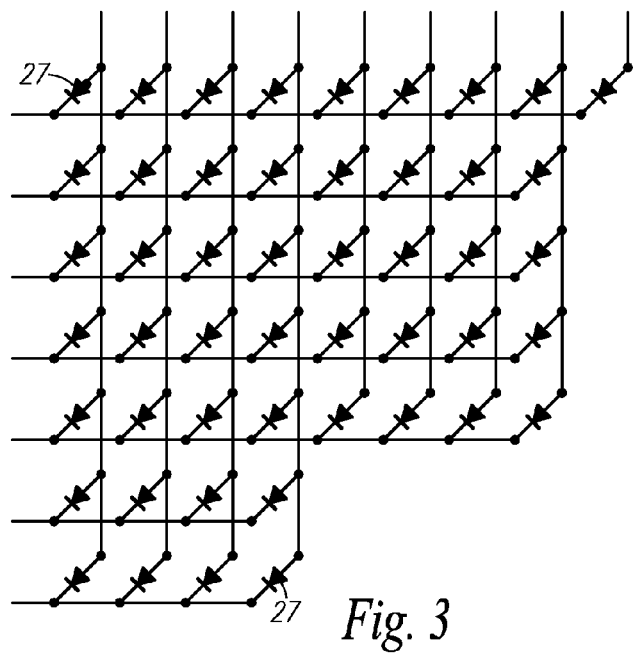
FIG. 3 is a schematic electrical diagram of the display device in FIG. 2.

With reference to FIG. 2 and FIG. 3, the display device 19 will be discussed in detail. FIG. 2 shows a packaged display device 19 for conveying information both graphically and alphanumerically at the same time. The display device 19 includes the annular bar graph 22 and the multi-segment display 23 located centrally of (i.e., within) the annular bar graph. The multi-segment display 23 is a numerical display (i.e., capable of displaying numbers and optionally letters and/or characters). In an embodiment, the multi-segment display 23 can display variable alphanumeric information. The display device 19 can also include fixed text elements 25 located centrally of the annular bar graph and adjacent to the multi-segment display, for selectively displaying fixed strings of text.

The annular bar graph 22, multi-segment display 23 and fixed text elements 25 have light-emitting elements 27 (see FIG. 3) associated therewith for creating the displayed information through selective activation of the light-emitting elements 27. Example light-emitting elements can include for example, LEDs, vacuum fluorescent displays and liquid crystal displays. It is to be appreciated that any other suitable light-emitting element can be used.

The light-emitting elements 27 are mounted within a common housing 29 to form the packaged display device 19. The light-emitting elements 27 can be mounted within a cylindrical portion of the common housing 29. The common housing 29 can include a printed circuit board 31 for connecting the light-emitting elements to another circuit. The printed circuit board 31 can include a plurality of terminals 32 that are capable of being connected to, e.g., soldered to, the substrate 13 (see FIG. 1). In an embodiment, the display device 19 is adapted for surface mounting to the substrate 13. The terminals 32 of the display device 19 can be soldered to a lower surface (not shown in FIG. 1) of the substrate 13 to secure the display device to the substrate. The display device 19 can be adapted for automated assembly to the substrate using known techniques for automated assembly of printed circuit boards.

It is to be appreciated that the annular bar graph 22 and the multi-segment display 23 can be provided as separate components, rather than housed in the common housing 29.

As shown in FIG. 3, in an embodiment in which the light-emitting elements 27 include LEDs, the LEDs of the display device 19 can be arranged electrically as a matrix of rows and columns. Selected LEDs can be activated by switching the appropriate row and column terminals to form a completed electrical circuit. The row and column terminals correspond to respective terminals 32 on the printed circuit board 31 of the display device 19. In the embodiment shown in FIG. 3, the display device 19 includes forty-nine (49) LEDs allocated among seven (7) rows and nine (9) columns. It is to be appreciated that the display device can include more or fewer than 49 LEDs, which can be allocated to various rows and columns as desired.

The annular bar graph 22 is formed by a plurality of light-emitting elements arranged in a circle. Each light-emitting element forms a small segment of the annular bar graph 22. In an embodiment, each small segment is an arcuate segment. In an embodiment, the annular bar graph 22 comprises twenty-five (25) light-emitting elements. It is to be appreciated that the annular bar graph 22 can include more or fewer than 25 light-emitting elements.

Via selective activation of the light-emitting elements, various display effects can be created using the annular bar graph 22. For example, a single light-emitting element can be activated to provide a small light segment. The small light segment can be made to move clockwise or counterclockwise around the annular bar graph 22 by appropriately activating and deactivating light-emitting elements in sequence. The small light segment can be lengthened in a clockwise and/or counterclockwise direction by activating adjacent light-emitting elements. The lengthened light segment can be made to move around the annular bar graph 22 and can also be contracted or shortened into a smaller light segment. Further, multiple light segments can be displayed and made to move around the annular bar graph 22 or lengthened/shortened simultaneously.

As noted above, the multi-segment display 23 can display variable alphanumeric information. The variable alphanumeric information can be related to information displayed graphically by the annular bar graph 22. For example, a light segment displayed by the annular bar graph 22 can graphically represent a level (e.g., a power level). The same level can simultaneously be displayed as a number on the multi-segment display 23. As the light segment moves or is lengthened/contracted on the annular bar graph 22, the number displayed by the multi-segment display 23 can change correspondingly.

The annular bar graph 13 and multi-segment display 15 can also display different information. For example, the multi-segment display 15 can display a level setting set by a user while the annular bar graph 13 displays a monitored condition, such as a temperature.

As noted above, the display device 19 can include fixed text elements 25 for selectively displaying fixed strings of text within the annular bar graph 22. The fixed text elements 25 are displayed by activating one or more light-emitting elements associated with the text elements 25. In FIG. 2, the example text elements "power boost" and "hot surface" can be displayed by simultaneously activating several light-emitting elements that are respectively associated with one of the text elements. For example, each text element 25 can have four (4) associated light-emitting elements, which are activated simultaneously to display the corresponding text element.

With reference to FIG. 1 through FIG. 4, operations of the user interfaces 21 are controlled by one or more controllers 33. The controller 33 can be located on the user interface board 11 or remote from the user interface board. The controller can include a processor for executing a set of programmed instructions that cause the controller to provide the functionality ascribed to it herein. The controller can include touch sensor circuitry for controlling operations of the touch sensor electrodes 15a, 15b. Based on capacitance changes at the electrodes 15a, 15b, the touch sensor circuitry determines the occurrence of touch events. In an embodiment, the processor and touch sensor circuitry are included within a single integrated circuit. An example integrated circuit incorporating a processor and touch sensor circuitry is model CY8C24894 from Cypress Semiconductor Corp. In another embodiment, the processor and touch sensor circuitry are provided in separate integrated circuits and the processor communicates with the touch sensor circuitry. It is to be appreciated that controller including the touch sensor circuitry could be formed from discrete electronic components.

The controller 33 monitors the touch sensor electrodes 15a, 15b for occurrences of touch events. The controller 33 selectively activates the light-emitting elements 27 of the display device 19. The controller 33 can communicate with remote devices, such as other controllers.

Each user interface 21 can have a dedicated controller 33. Alternatively, a single controller 33 can control plural user interfaces 21, such as two, three, four, etc. The number of user interfaces 21 that can be controlled by a single controller 33 will typically be limited by the available inputs and outputs on the controller.

The user interfaces 21 can be used to control operations of devices requiring a level or magnitude setting. In particular, the user interfaces 21 can be part of a control panel for a domestic appliance, for controlling operations of the appliance. Example domestic appliances include dishwashers, washing machines, clothes dryers, refrigerators, freezers, stoves, cooktops, microwave ovens, etc.

Figure 4:
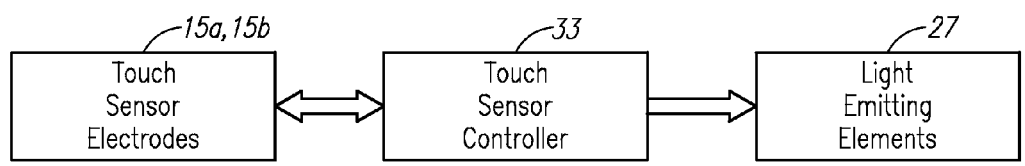
FIG. 4 is a schematic block diagram of the user interface board of FIG. 1
Figure 5:
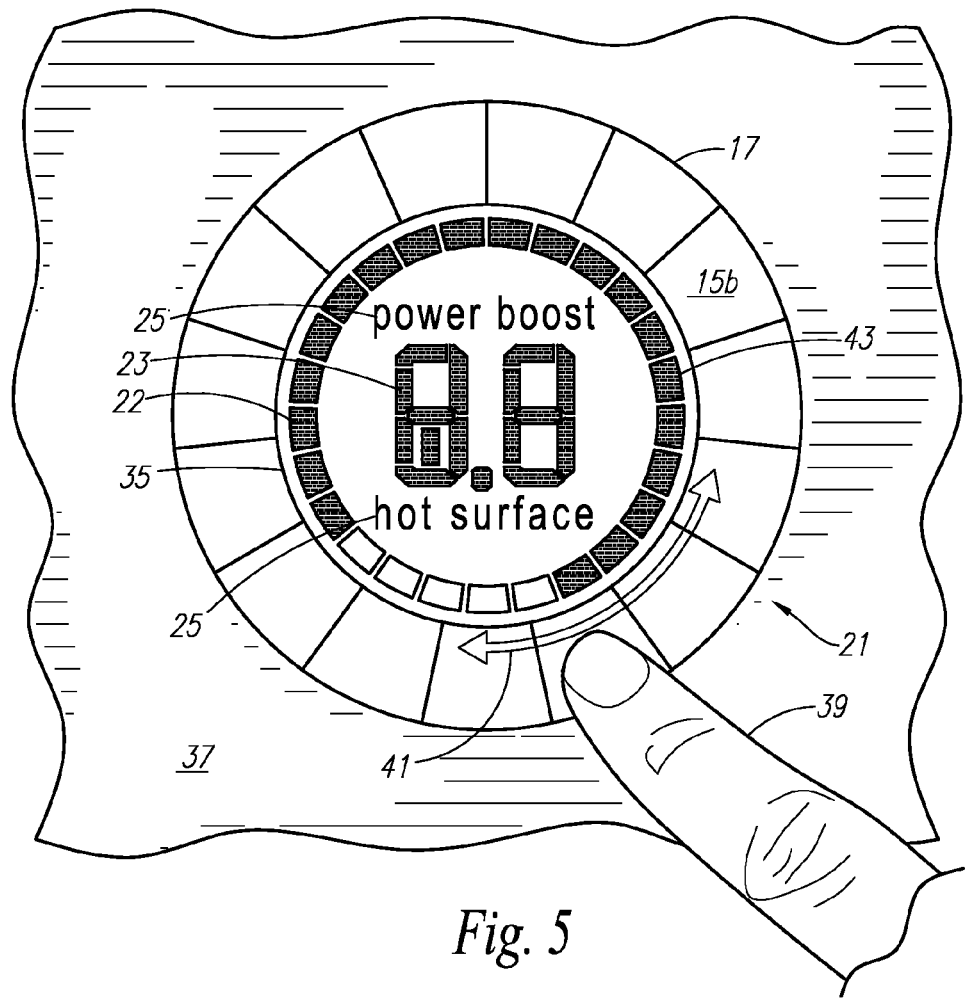
FIG. 5 is a partial plan view of the user interface board of FIG. 1.

Operation of the user interfaces 21 will be described below in the context of setting a power level for a heating element in a cooktop. Referring to FIG. 1, FIG. 4 and FIG. 5, a user can slide a finger 39 in a circular motion 41 clockwise or counterclockwise along the annular touch sensor array 17 to provide a rotational input to the touch sensor controller 33. The rotational input can provide a magnitude or level setting to the controller 33. For example, sliding the finger 39 in a first direction, e.g., clockwise, increases a power level setting for a corresponding heating element. Sliding the finger 39 in a second direction, e.g., counterclockwise, decreases the power level setting for the corresponding heating element.

The power level for the heating element can additionally be set using the touch sensor electrodes 15a located beneath the annular touch sensor array 17. For example, a first one of the touch sensor electrodes 15a can provide a "plus" function to increase the power level setting and a second one of the touch sensor electrodes can provide a "minus" function to decrease the power level setting. A third one of the touch sensor electrodes 15a can provide an "on/off" function for activating/deactivating the heating element. It is to be appreciated that the user interface 21 provides both an analog-type input via the annular touch sensor array and a digital-type input via the touch sensor electrodes 15a located beneath the annular touch sensor array 17.

The touch sensor controller 33 can either directly control the power supplied to the corresponding heating element in accordance with the power level setting, or communicate the power level setting to a remote heating element controller.

The magnitude of the power level setting is displayed to the user by the annular bar graph 22 and the multi-segment display 23. As the user slides the finger 39 to increase the power level, a rotational light display is generated by the annular bar graph 22. For example, a light segment 43 displayed by the annular bar graph can be made to lengthen as the power level is increased, or a small light segment can be made to move with the finger 39 as power level is increased. As the power level is decreased, the light segment 43 can be made to contract or shorten, or the small light segment can be made to move with the finger 39.

It is to be appreciated that the annular bar graph 22 imitates an analog gauge and graphically displays information to the user in an analog-type format. While the annular bar graph 22 displays the power level information graphically, the multi-segment display 23 displays the power level information numerically or alphanumerically. For example, the multi-segment display 23 can display a decimal number to indicate the power level (e.g. "7.3"), or text such as "HI" or "LO" to indicate the power level. The display device 19, therefore, can display information both graphically and through text.

An example power-setting operation can include sliding the finger 39 from a 6:00 position on the annular touch sensor array 17 to a 12:00 position, to establish a "medium" power level setting. As the finger 39 is moved to the 12:00 position, a light segment can lengthen into a semicircle or move with the finger, and the multi-segment display 23 can display appropriate text (e.g., "5.0"). Subsequently, the finger 39 can be slid from 12:00 position to the 9:00 position to reduce the power level setting. As the finger 39 is moved to the 9:00 position, the light segment can shorten into a quarter circle or move with the finger, and the multi-segment display 23 can display appropriate text (e.g., "2.5").

Rather than sliding the finger 39 along the annular touch sensor array 17 to increase or decrease a setting, a user can directly touch portions of the annular touch sensor array to change the setting. For example, the finger 39 can be slid from the 6:00 position to the 12:00 position to establish an initial setting. Subsequently, the 3:00 position can be directly touched once, twice etc., to increase the setting to that position, rather than sliding the finger 39 from the 12:00 position to the 3:00 position.

Figure 6:
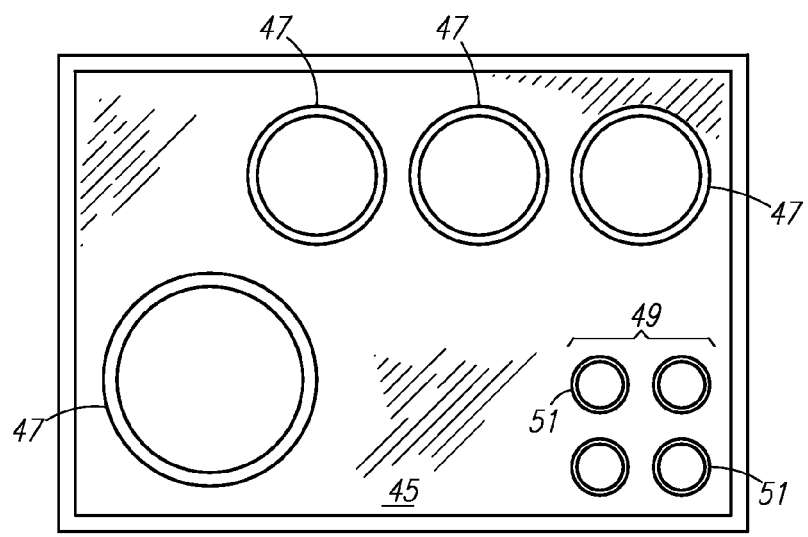
FIG. 6 is a plan view of a cooktop.

Referring to FIG. 1 and FIG. 6, the user interface board 11 can be mounted to a touch surface substrate that a user touches to activate the touch sensors on the user interface board 11. Example touch surface substrates include glass and plastic panels. The touch surface substrate can be part of a control panel for a domestic appliance. As shown in FIG. 6, the domestic appliance can be a cooktop 45 having a plurality of heating elements 47 (e.g., electrical resistance or induction heating elements), and the user interface board 11 can control operations of the heating elements according to user touches on the cooktop. In FIG. 6, the cooktop 45 is the touch surface substrate and the user interface board 11 is attached (e.g., fastened or adhered) to the underside of the cooktop 45. For example, the substrate 13 can be glued to the underside of the cooktop. The cooktop 45 has a touch control area 49 in register with the user interfaces 21, which are mounted directly beneath the touch control area 49. The touch control area 49 includes graphics 51 to inform the user of the location of the annular touch sensor arrays 17. The graphics 51 can have approximately the same diameter as a conventional knob commonly found on cooking devices.

The touch surface substrate (e.g., the cooktop 45) can be translucent or light-diffusing so that the annular bar graph, multi-segment display and fixed text elements are not visible when their corresponding light-emitting elements are deactivated.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A user interface, comprising:
   a substrate having a through-hole;
   an annular touch sensor array located on an upper surface of the substrate and at least partially surrounding the through-hole, the annular touch sensor array having an inner circumference and an outer circumference; and
   a display device in alignment with the through-hole, the display device comprising:
      a circular upper surface in alignment with the through-hole and substantially flush with the upper surface of the substrate to form a substantially continuous surface of the user interface;
      a plurality of terminals for surface mounting the display device to the substrate; and
      a plurality of light-emitting elements forming an annular bar graph located entirely within the inner circumference of the annular touch sensor array.

2. The user interface of claim 1, wherein the display device is mounted in the through-hole.

3. The user interface of claim 1, wherein the user interface controls an operation of a cooking appliance, the cooking appliance comprising:
   a heating element; and
   a cooktop having a cooktop upper surface,
      wherein a touch control area is provided on the cooktop upper surface,
      wherein the user interface is mounted beneath the touch control area, and
      wherein a power level of the heating element is set in accordance with a rotational input using the annular touch sensor array.

4. The user interface of claim 1, wherein based on a rotational input using the annular touch sensor array, a corresponding rotational light display is generated by the annular bar graph.

5. The user interface of claim 1, wherein the display device comprises a numerical display located within the annular touch sensor array and the annular bar graph wherein the annular bar graph displays information graphically, and the numerical display simultaneously displays the same information numerically.

6. The user interface of claim 5, wherein the numerical display comprises a further plurality of light-emitting elements forming a multi-segment display.

7. The user interface of claim 6, wherein based on a rotational input using the annular touch sensor array, a number displayed by the multi-segment display changes.

8. The user interface of claim 1, wherein the display device further comprises a numerical display located within the annular touch sensor array, the numerical display including a further plurality of light-emitting elements forming a multi-segment display,
wherein the plurality of light-emitting elements forming the annular bar graph and the further plurality of light-emitting elements forming the multi-segment display are arranged electrically as a matrix between both of a first group of the plurality of terminals and a second group of the plurality of terminals, the display device being surface mounted to a lower surface of the substrate.

9. A user interface, comprising:
a substrate having a through-hole formed therein;
an annular touch sensor array located on the substrate around the through-hole the annular touch sensor array having an inner circumference and an outer circumference; and
a display device located within the through-hole, the display device comprising:
a plurality of light-emitting elements forming an annular bar graph, wherein the annular bar graph is located entirely inside of the inner circumference of the annular touch sensor array; and
a numerical display located within the annular bar graph, wherein the annular bar graph displays information graphically, and the numerical display simultaneously displays the same information numerically,
wherein the numerical display comprises a further plurality of light-emitting elements forming a multi-segment display, and
wherein the plurality of light-emitting elements forming the annular bar graph and the further plurality of light-emitting elements forming the multi-segment display are arranged electrically as a matrix between both of a first group of terminals and a second group of terminals for surface mounting the display device to the substrate.

10. The user interface of claim 9, wherein the user interface controls an operation of a cooking appliance, the cooking appliance comprising:
a heating element; and
a cooktop having an upper surface,
wherein a touch control area is provided on the upper surface,
wherein the user interface is mounted beneath the touch control area, and
wherein a power level of the heating element is set in accordance with a rotational input using the annular touch sensor array.

11. The user interface of claim 10,
wherein the annular bar graph displays the power level graphically, and the numerical display simultaneously displays the power level numerically, and
wherein based on the rotational input using the annular touch sensor array, a corresponding rotational light display is generated by the annular bar graph.

12. A user interface, comprising:
a substrate having a through-hole formed therein;
an annular touch sensor array located on the substrate around the through-hole the annular touch sensor array having an inner circumference and an outer circumference; and
a display device located within the through-hole, the display device comprising:
a plurality of light-emitting elements forming an annular bar graph, wherein the annular bar graph is located entirely inside of the inner circumference of the annular touch sensor array; and
a numerical display located within the annular bar graph, wherein the annular bar graph displays information graphically, and the numerical display simultaneously displays the same information numerically, wherein the annular touch sensor array is located on an upper surface of the substrate;
wherein the numerical display comprises a further plurality of light-emitting elements forming a multi-segment display, and
wherein the plurality of light-emitting elements forming the annular bar graph and the further plurality of light-emitting elements forming the multi-segment display are mounted within a cylindrical portion of a common housing of the display device, the common housing further comprising a printed circuit board including a plurality of terminals for surface mounting the display device to a lower surface of the substrate.

13. The user interface of claim 12, wherein the user interface controls an operation of a cooking appliance, the cooking appliance comprising:
a heating element; and
a cooktop having an upper surface,
wherein a touch control area is provided on the upper surface,
wherein the user interface is mounted beneath the touch control area, and
wherein a power level of the heating element is set in accordance with a rotational input using the annular touch sensor array.

14. The user interface of claim 13,
wherein the annular bar graph displays the power level graphically, and the numerical display simultaneously displays the power level numerically, and
wherein based on the rotational input using the annular touch sensor array, a corresponding rotational light display is generated by the annular bar graph.

* * * * *